United States Patent
Eshun

(10) Patent No.: US 9,431,533 B2
(45) Date of Patent: Aug. 30, 2016

(54) METHOD TO ENABLE HIGHER CARBON CO-IMPLANTS TO IMPROVE DEVICE MISMATCH WITHOUT DEGRADING LEAKAGE

(71) Applicant: Texas Instruments Incorporated, Dallas, TX (US)

(72) Inventor: Ebenezer Eshun, Frisco, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/732,769

(22) Filed: Jun. 7, 2015

(65) Prior Publication Data

US 2015/0364600 A1 Dec. 17, 2015

Related U.S. Application Data

(60) Provisional application No. 62/011,871, filed on Jun. 13, 2014.

(51) Int. Cl.
*H01L 21/02* (2006.01)
*H01L 29/78* (2006.01)
*H01L 21/265* (2006.01)
*H01L 21/268* (2006.01)
*H01L 29/66* (2006.01)
*H01L 29/10* (2006.01)

(52) U.S. Cl.
CPC ......... *H01L 29/7836* (2013.01); *H01L 21/268* (2013.01); *H01L 21/26506* (2013.01); *H01L 21/26586* (2013.01); *H01L 29/1083* (2013.01); *H01L 29/6659* (2013.01); *H01L 21/26513* (2013.01)

(58) Field of Classification Search
USPC ........ 257/151–153, 249, 314–320, 331, 336, 257/387, 412, E29.125–E29.131, 257/E29.134–E29.138, E29.14–E29.161, 257/E29.275, E29.319, E21.176–E21.186, 257/E21.374, E21.458, E21.621–E21.624, 257/E21.635–E21.638, E21.432, E21.44, 257/E21.619–E21.62, 288, 401, 901; 438/157, 176, 195, 267, 283, 585–596
See application file for complete search history.

(56) References Cited

U.S. PATENT DOCUMENTS

2010/0230721 A1* 9/2010 Yasutake ............... H01L 29/165 257/192
2010/0237440 A1* 9/2010 Ito ..................... H01L 21/26506 257/408

* cited by examiner

*Primary Examiner* — Dao H Nguyen
*Assistant Examiner* — Tram H Nguyen
(74) *Attorney, Agent, or Firm* — Jacqueline J. Garner; Frank D. Cimino

(57) ABSTRACT

An integrated circuit containing an NMOS transistor with a boron-doped halo is formed by co-implanting carbon in at least three angled doses with the boron halo implants. The carbon is co-implanted at tilt angles within 5 degrees of the boron halo implant tilt angle. An implant energy of at least one of the angled carbon co-implant is greater than the implant energy of the boron halo implant. A total carbon dose of the angled carbon co-implants is at least 5 times a total boron dose of the boron halo implants. The NMOS transistor has a carbon concentration in the halo regions which is at least 5 times greater than the boron concentration in the halo regions. The co-implanted carbon extends under the gate of the NMOS transistor.

20 Claims, 4 Drawing Sheets

METHOD TO ENABLE HIGHER CARBON CO-IMPLANTS TO IMPROVE DEVICE MISMATCH WITHOUT DEGRADING LEAKAGE

CROSS-REFERENCE TO RELATED APPLICATIONS

This application claims the benefit of priority under U.S.C. §119(e) of U.S. Provisional Application 62/011,871, filed Jun. 13, 2014, which is hereby incorporated by reference in its entirety.

FIELD OF THE INVENTION

This invention relates to the field of integrated circuits. More particularly, this invention relates to n-channel MOS transistors in integrated circuits.

BACKGROUND OF THE INVENTION

Some integrated circuits with n-channel metal oxide semiconductor (NMOS) transistors are fabricated with boron halo implants to reduce short-channel effects. As gate lengths have shrunk below 65 nanometers, boron diffusion from the halo implants has produced undesirable effects including threshold mismatch between transistors. Carbon co-implantation in NMOS transistors is used to control boron diffusion, thus to improve the threshold mismatch which is critical for memory yield. However, carbon implantation aggravates band-to-band tunneling which increases gate-induced drain leakage (GIDL) and also increased gate leakage both of which in turn increases product power consumption. Achieving desired levels of threshold mismatch and power consumption has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an NMOS transistor is formed by co-implanting carbon in at least three angled doses with boron halo implants. The carbon is co-implanted at tilt angles within 5 degrees of the boron halo implant tilt angles. An implant energy of at least one of the angled carbon co-implant is greater than the implant energy of the boron halo implant. A total carbon dose of the angled carbon co-implants is at least 5 times a total boron dose of the boron halo implants. The NMOS transistor has a carbon concentration the halo regions which is at least 5 times greater than the boron concentration in the halo regions. The carbon extends under the gate of the NMOS transistor.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
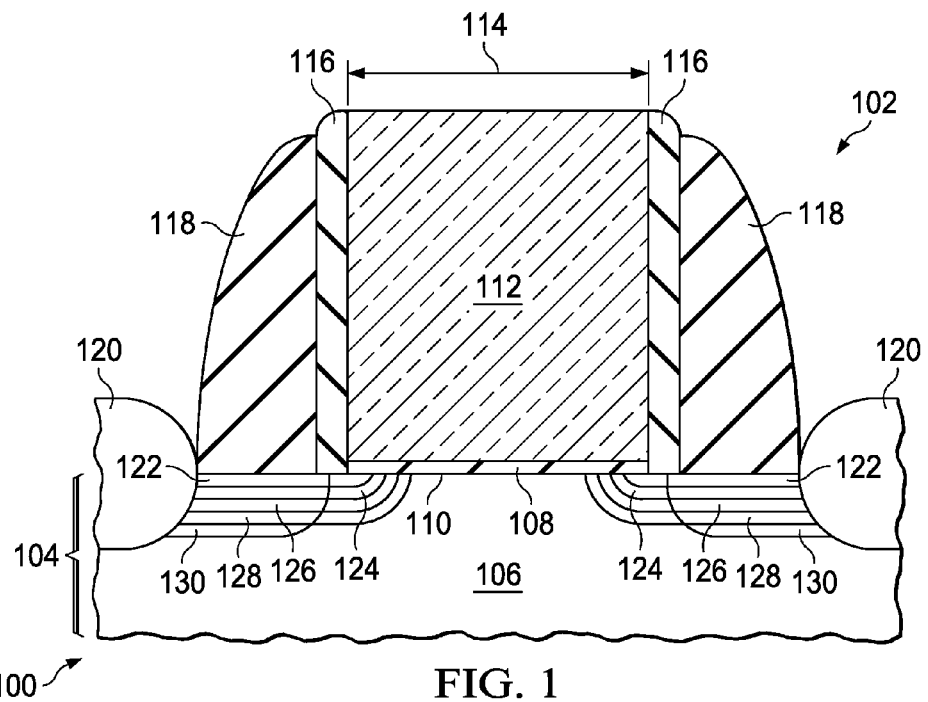
FIG. 1 is a cross section of an example integrated circuit.

FIG. 1 is a cross section of an example integrated circuit. The integrated circuit 100 contains an NMOS transistor 102 formed by three angles carbon co-implants. The integrated circuit 100 is formed on a substrate 104 comprising p-type semiconductor material 106 under the NMOS transistor 102. The substrate 104 may be a silicon wafer, possibly with a silicon epitaxial layer. The p-type semiconductor material 106 is primarily silicon. The NMOS transistor 102 includes a gate dielectric layer 108 disposed at a top surface 110 of the substrate 104. The p-type semiconductor material 106 extends to the top surface 110 under the gate dielectric layer 108. The gate dielectric layer 108 may comprise primarily thermally-grown silicon dioxide, possibly nitridated, or may include one or more layers of deposited high-k dielectric material such as hafnium oxide and/or zirconium oxide. The gate dielectric layer 108 may be, for example, 1 nanometer to 2.5 nanometers thick. The NMOS transistor 102 includes a gate 112 disposed on the gate dielectric layer 108. The gate 112 may include polycrystalline silicon, commonly referred to as polysilicon, with n-type dopants such as phosphorus and arsenic, and possibly antimony to provide a desired work function. Alternatively, the gate 112 may be formed by a replacement gate process, and may include layers of metal such as titanium, titanium nitride, tantalum, tantalum nitride and/or aluminum. A physical gate length 114 of the gate 112 may be less than 30 nanometers. Offset spacers 116 are disposed on lateral surfaces of the gate 112. The offset spacers 116 may include one or more layers of silicon dioxide and/or silicon nitride, and may be 1 nanometer to 10 nanometers thick. Sidewall spacers 118 may optionally be disposed on the substrate 104, abutting the offset spacers 116. The sidewall spacers 118 may include one or more layers of silicon nitride, silicon dioxide, and/or other dielectric material. The sidewall spacers 118 may be 20 nanometers to 50 nanometers wide at the top surface 110 of the substrate 104. The sidewall spacers 118 may possibly be removed during fabrication and so may be absent in the completed integrated circuit 100. Metal silicide 120 may optionally be disposed at the top surface 110 of the substrate 104 adjacent to the sidewall spacers 118.

The NMOS transistor 102 includes a first carbon-diffused region 122 in the substrate 104 adjacent to, and extending 1 nanometer to 10 nanometers under the gate 112 on a source side of the gate 112 and on a drain side of the gate 112 opposite the source side. The lateral extent of the first carbon-diffused region 122 under the gate 112 results from the carbon in the first carbon-diffused region 122 being implanted at a tilt angle greater than 15 degrees. A peak of a carbon distribution of the first carbon-diffused region 122 is, for example, 15 nanometers to 25 nanometers under the top surface 110 of the substrate 104. A total amount of carbon in the first carbon-diffused region 122 may correspond to an implant dose greater than $1 \times 10^{14}$ cm$^{-2}$.

The NMOS transistor 102 includes a second carbon-diffused region 124 in the substrate 104 adjacent to the gate 112 on the source side and the drain side of the gate 112, and extending 1 nanometer to 5 nanometers further under the gate 112 than the first carbon-diffused region 122. The lateral extent of the second carbon-diffused region 124 under the gate 112 results from the carbon in the second carbon-diffused region 124 being implanted at a tilt angle greater than 15 degrees and at a higher energy than the carbon in the first carbon-diffused region 122. A peak of a carbon distribution of the second carbon-diffused region 124 is 5 nanometers to 10 nanometers below the peak of the carbon distribution of the first carbon-diffused region 122. A total amount of carbon in the second carbon-diffused region 124 may correspond to an implant dose greater than $1 \times 10^{14}$ cm$^2$.

The NMOS transistor 102 includes a halo region 126 doped with boron in the substrate 104 adjacent to the gate 112 on the source side and the drain side of the gate 112, and extending 1 nanometer to 5 nanometers further under the gate 112 than the first carbon-diffused region 122. The lateral extent of the halo region 126 under the gate 112 results from the boron in the halo region 126 being implanted at a tilt angle greater than 15 degrees. A peak of a boron distribution of the halo region 126 is 2 nanometers to 10 nanometers below the peak of the carbon distribution of the second carbon-diffused region 124. A total amount of boron in the halo region 126 may correspond to an implant dose less than $1 \times 10^{14}$ cm$^{-2}$.

The NMOS transistor 102 includes a third carbon-diffused region 128 in the substrate 104 adjacent to the gate 112 on the source side and the drain side of the gate 112, and extending a few nanometers further under the gate 112 than the halo region 126. The lateral extent of the third carbon-diffused region 128 under the gate 112 results from the carbon in the third carbon-diffused region 128 being implanted at a tilt angle greater than 15 degrees and at a higher energy than the boron in the halo region 126. A peak of a carbon distribution of the third carbon-diffused region 128 is 2 nanometers to 10 nanometers below the peak of the boron distribution of the halo region 126. A total amount of carbon in the third carbon-diffused region 128 may correspond to an implant dose greater than $1 \times 10^{14}$ cm$^{-2}$.

In the instant example, the NMOS transistor 102 includes a fourth carbon-diffused region 130 in the substrate 104 adjacent to the gate 112 on the source side and the drain side. The fourth carbon-diffused region 130 does not extend under the gate 112 more than 1 nanometer, due to the carbon in the fourth carbon-diffused region 130 being implanted at a tilt angle less than 4 degrees, and possibly at substantially no tilt angle. In the instant example, the carbon in the fourth carbon-diffused region 130 is implanted at a higher energy than the boron in the halo region 126, so that peak of a carbon distribution of the fourth carbon-diffused region 130 is 2 nanometers to 10 nanometers below the peak of the boron distribution of the halo region 126.

N-type dopant implanted regions, such as drain extensions and deep source and drain regions, are not shown in FIG. 1 to avoid obscuring the spatial relationships of the carbon-diffused regions 122, 124, 128 and 130, and the halo region 126. The drain extensions are disposed in the substrate 104 adjacent to the gate 112 on the source side and the drain side. The drain extensions do not extend as far under the gate 112 as the halo region 126.

A total amount of carbon in the first carbon-diffused region 122, the second carbon-diffused region 124 and the third carbon-diffused region 128 is at least 5 times a total amount of boron in the halo region 126. The amounts of carbon in the first carbon-diffused region 122, the second carbon-diffused region 124, the third carbon-diffused region 128 and the fourth carbon-diffused region 130 are set by carbon doses when the carbon-diffused regions 122, 124, 128 and 130 are implanted. The doses are selected to provide a desired balance between controlling diffusion of the boron in the halo region 126 and providing an acceptable level of leakage current. Implanting the carbon in four doses with different energies provides a desired total dose of carbon while avoiding a peak concentration that undesirably produces excess leakage current. The carbon in the first carbon-diffused region 122, the second carbon-diffused region 124 and the third carbon-diffused region 128 control diffusion of the boron in a portion of the halo region 126 under the gate 112. The third carbon-diffused region 128, having the peak of the carbon distribution below and further under the gate 112 than the halo region 126 advantageously controls diffusion of the boron more effectively than an equivalent, but more shallow, carbon co-implanted region. The total amount of carbon in the first carbon-diffused region 122, the second carbon-diffused region 124, the third carbon-diffused region 128 and the fourth carbon-diffused region 130 advantageously control diffusion of the boron more effectively than an equivalent, but more lightly doped, set of carbon-diffused regions. The advantages described herein are particularly important for instances of the NMOS transistor 102 in which the physical gate length 114 of the gate 112 is less than 30 nanometers, because it is difficult to attain desired values of threshold uniformity and leakage current without significantly increasing fabrication cost and complexity. Experiments performed in pursuit of the instant example have demonstrated particular effectiveness in attaining desired values of threshold uniformity and leakage current when the physical gate length 114 of the gate 112 is less than 30 nanometers and the total amount of carbon in the first carbon-diffused region 122, the second carbon-diffused region 124 and the third carbon-diffused region 128 and the fourth carbon-diffused region 130 corresponds to a total implant dose of at least $1 \times 10^{15}$ cm$^{-2}$.

Figure 2A:
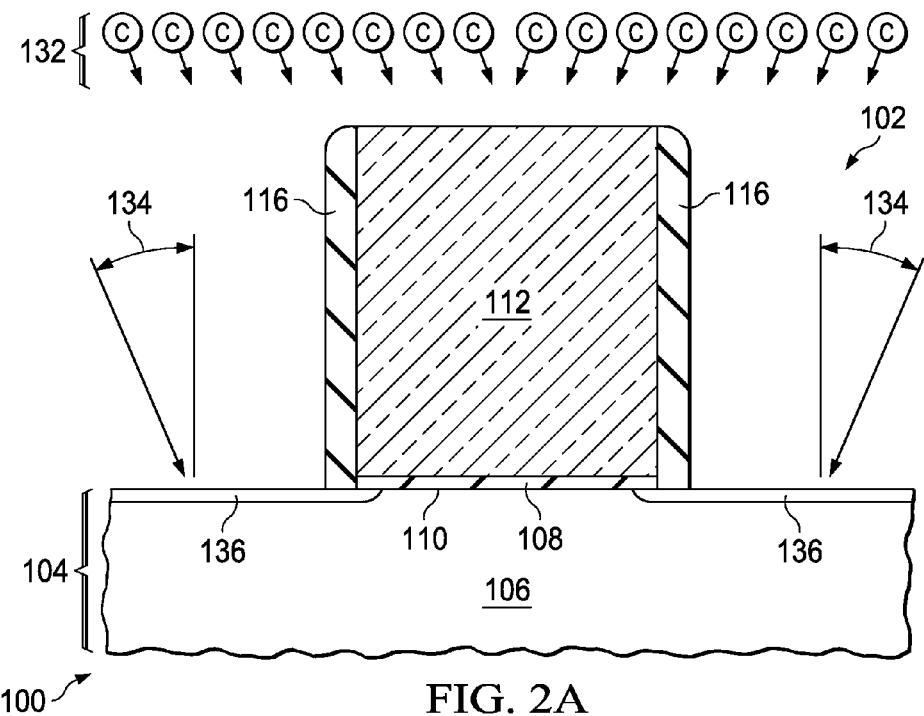
FIG. 2A through FIG. 2F are cross sections of the integrated circuit of FIG. 1, depicted in successive stages of an example method of forming the NMOS transistor.

FIG. 2A through FIG. 2F are cross sections of the integrated circuit of FIG. 1, depicted in successive stages of an example method of forming the NMOS transistor. Referring to FIG. 2A, the gate dielectric layer 108 is formed at the top surface 110 of the p-type semiconductor material 106. The gate dielectric layer 108 may be formed by thermal oxidation of silicon in the p-type semiconductor material 106, or may be formed by deposition of high-k dielectric material. The gate dielectric layer 108 may be a temporary, or sacrificial, layer in a gate replacement process or may be a permanent layer. The gate 112 is formed on the gate dielectric layer 108. The gate 112 may be formed by forming a layer of polycrystalline silicon, referred to as polysilicon, on the gate dielectric layer 108, forming an etch mask over the layer of polysilicon, and etching the layer of polysilicon to form the gate 112. The offset spacers 116 are formed on lateral surfaces of the gate 112, for example by forming a layer of thermal oxide on the gate 112 and/or forming one or more conformal layers of silicon dioxide and/or silicon nitride over the gate 112, followed by an anisotropic plasma etch to remove the conformal layers from the top surface 110 of the substrate 104, leaving the offset spacers 116.

A first dose of carbon 132 is implanted at a first tilt angle 134 greater than 15 degrees into the substrate 104 adjacent to, and partway under, the gate 112 to form a first angled carbon co-implanted region 136. The first dose of carbon 132 may be implanted in four steps with equal sub-doses, each with the same first tilt angle 134 and twist angles of 0 degrees, 90 degrees, 180 degrees and 270 degrees, to provide uniform carbon distributions for the NMOS transistor 102. The first dose of carbon 132 may be implanted with an energy of 4 kilo-electron volts (keV) to 8 keV, for example. A total dose of the first dose of carbon 132 may be $1 \times 10^{14}$ cm$^{-2}$ to $1 \times 10^{15}$ cm$^{-2}$. A total dose less than $1 \times 10^{14}$ cm$^{-2}$ may fail to provide desired control of boron diffusion. A dose greater than $1 \times 10^{15}$ cm$^{-2}$ may produce more leakage current than is acceptable.

Figure 2B:
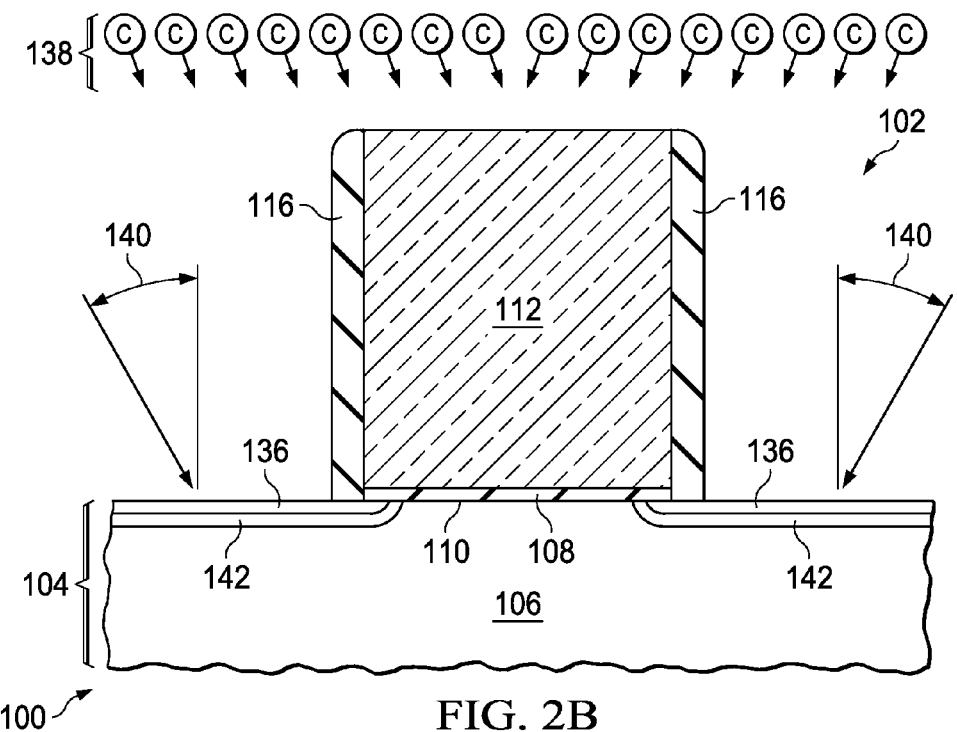

Referring to FIG. 2B, a second dose of carbon 138 is implanted at a second tilt angle 140 greater than 15 degrees into the substrate 104 adjacent to, and partway under, the gate 112 to form a second angled carbon co-implanted region 142. The second tilt angle 140 may be substantially equal to, or a few degrees greater than, the first tilt angle 134 of FIG. 2A. The second dose of carbon 138 may be implanted in four steps with equal sub-doses, each with the same second tilt angle 140 and twist angles of 0 degrees, 90 degrees, 180 degrees and 270 degrees, to provide uniform carbon distributions for the NMOS transistor 102. The second dose of carbon 138 may be implanted with an energy 2 keV to 4 keV higher than the energy of the first dose of carbon 132 of FIG. 2A. A total dose of the second dose of carbon 138 may be $1 \times 10^{14}$ cm$^{-2}$ to $1 \times 10^{15}$ cm$^{-2}$. A total dose less than $1 \times 10^{14}$ cm$^{-2}$ may fail to provide desired control of boron diffusion. A dose greater than $1 \times 10^{15}$ cm$^{-2}$ may produce more leakage current than is acceptable.

Figure 2C:
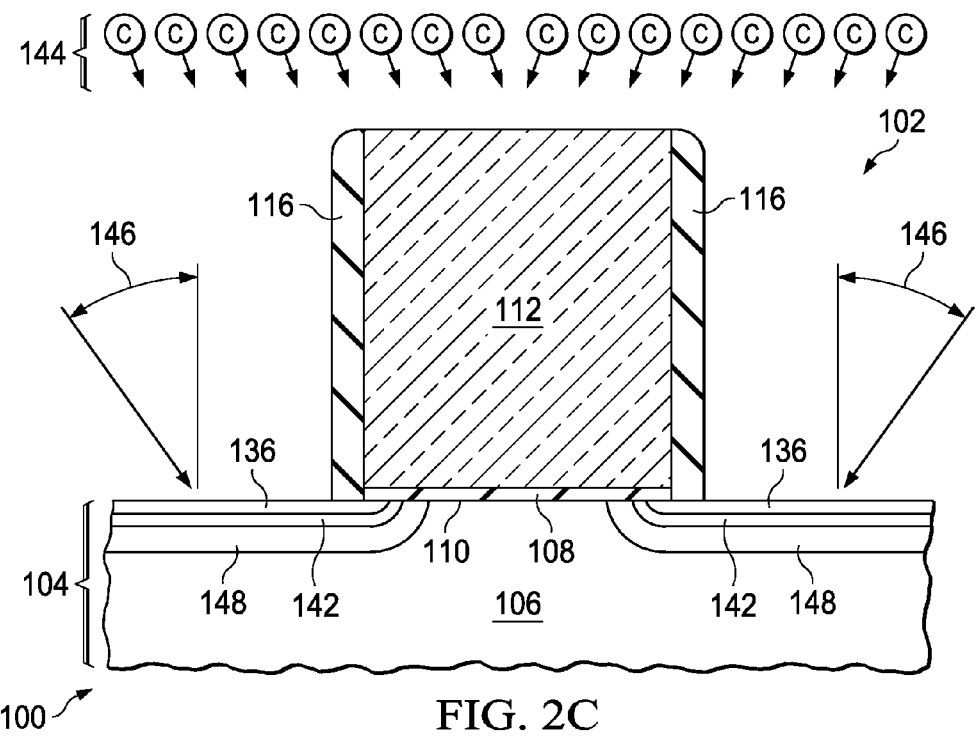

Referring to FIG. 2C, a third dose of carbon 144 is implanted at a third tilt angle 146 greater than 15 degrees into the substrate 104 adjacent to, and partway under, the gate 112 to form a third angled carbon co-implanted region 148. The third tilt angle 146 may be substantially equal to, or a few degrees greater than, the first tilt angle 134 of FIG. 2A. The third dose of carbon 144 may be implanted in four steps with equal sub-doses, each with the same third tilt angle 146 and twist angles of 0 degrees, 90 degrees, 180 degrees and 270 degrees, to provide uniform carbon distributions for the NMOS transistor 102. The third dose of carbon 144 may be implanted with an energy 2 keV to 4 keV higher than the energy of the second dose of carbon 138 of FIG. 2B. A total dose of the third dose of carbon 144 may be $1 \times 10^{14}$ cm$^{-2}$ to $1 \times 10^{15}$ cm$^{-2}$. A total dose less than $1 \times 10^{14}$ cm$^{-2}$ may fail to provide desired control of boron diffusion. A dose greater than $1 \times 10^{15}$ cm$^{-2}$ may produce more leakage current than is acceptable.

Figure 2D:
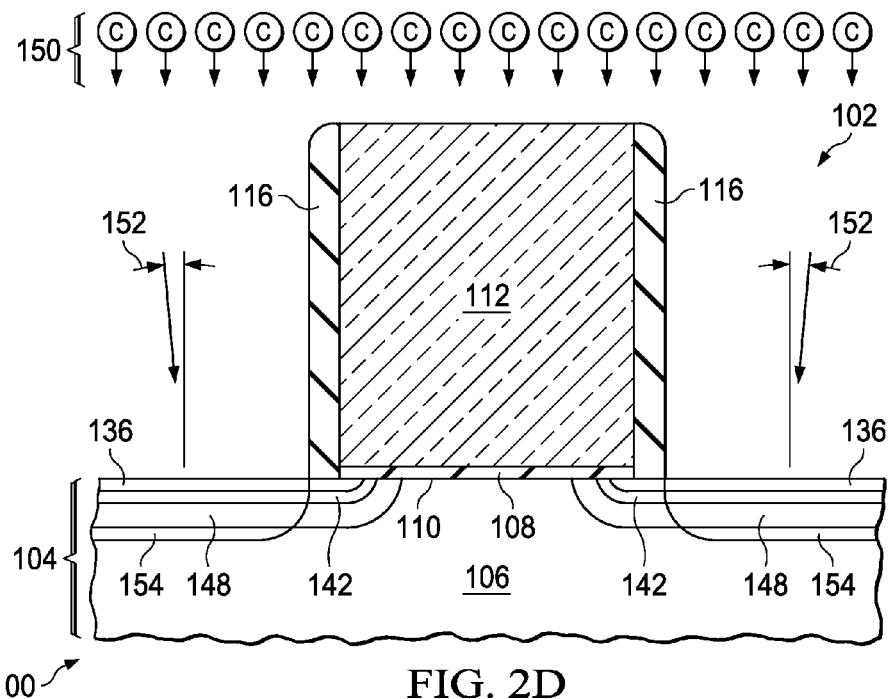

Referring to FIG. 2D, a fourth dose of carbon 150 is implanted at a fourth tilt angle 152, which is less than 4 degrees, into the substrate 104 adjacent to the offset spacers 116 to form a non-angled carbon co-implanted region 154. The fourth tilt angle 152 may be substantially zero. In versions of the instant example in which the fourth tilt angle 152 is greater than zero, the fourth dose of carbon 150 may be implanted in four steps with equal sub-doses, each with the same fourth tilt angle 152 and twist angles of 0 degrees, 90 degrees, 180 degrees and 270 degrees, to provide uniform carbon distributions for the NMOS transistor 102. In other versions of the instant example in which the fourth tilt angle 152 is substantially zero, the fourth dose of carbon 150 may be implanted in one step. The fourth dose of carbon 150 may be implanted with an energy about equal to the energy of the third dose of carbon 144 of FIG. 2C. A total dose of the fourth dose of carbon 150 may be $1 \times 10^{14}$ cm$^{-2}$ to $1 \times 10^{15}$ cm$^{-2}$. A total dose less than $1 \times 10^{14}$ cm$^{-2}$ may fail to provide desired control of boron diffusion. A dose greater than $1 \times 10^{15}$ cm$^{-2}$ may produce more leakage current than is acceptable.

Figure 2E:
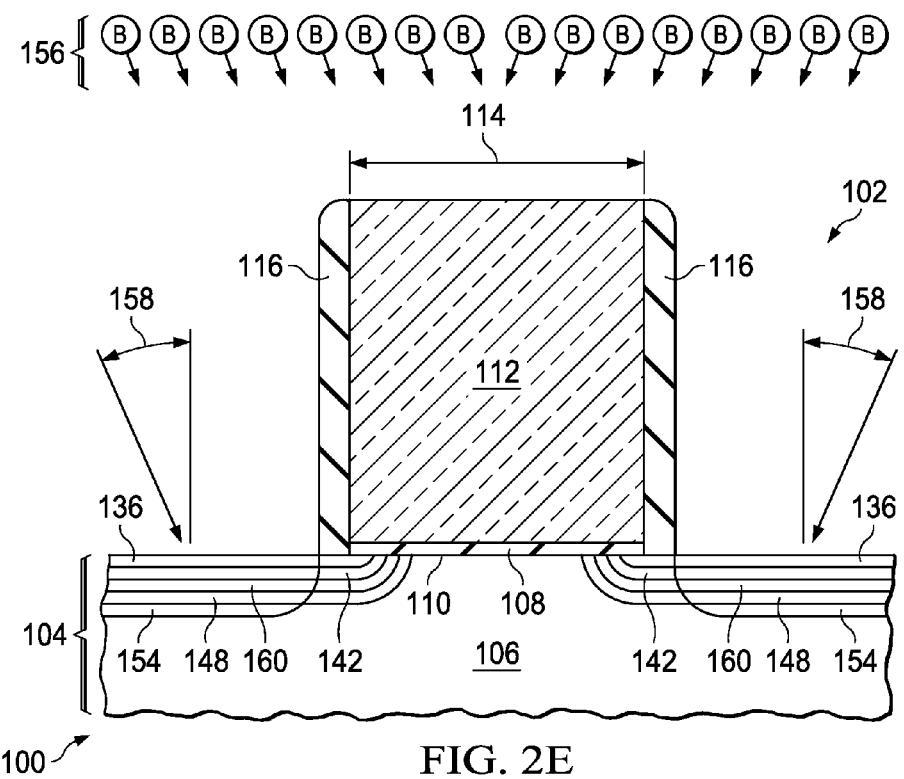

Referring to FIG. 2E, boron dopants 156 are implanted at a halo tilt angle 158 greater than 15 degrees into the substrate 104 adjacent to, and partway under, the gate 112 to form a halo implanted region 160. For instances of the NMOS transistor 102 in which the physical gate length 114 is less than 30 nanometers, a halo tilt angle 158 of about 25 degrees to about 30 degrees may advantageously provide a desired extension of the halo implanted region 160 under the gate 112. The boron dopants 156 may be atomic boron, boron difluoride (BF$_2$), a boron-carbon molecule such as a carborane, or other boron-containing species. The first tilt angle 134 of FIG. 2A, the second tilt angle 140 of FIG. 2B and the third tilt angle 146 of FIG. 2C are within 5 degrees of the halo tilt angle 158. The boron dopants 156 may be implanted in four steps with equal sub-doses, each with the same halo tilt angle 158 and twist angles of 0 degrees, 90 degrees, 180 degrees and 270 degrees, to provide uniform boron distributions for the NMOS transistor 102. The boron dopants 156 are implanted with an energy 2 keV to 4 keV less than the energy of the third dose of carbon 144 of FIG. 2C. A total dose of the boron dopants 156 may be less than $1 \times 10^{14}$ cm$^{-2}$, so as to provide a desired balance between reducing short channel effects and increasing threshold variability in the NMOS transistor 102.

The boron dopants 156 may advantageously be implanted after the first dose of carbon 132 of FIG. 2A, the second dose of carbon 138 of FIG. 2B, the third dose of carbon 144 of FIG. 2C and the fourth dose of carbon 150 of FIG. 2D, as the implanted carbon will at least partially amorphize the p-type semiconductor material 106 at the top surface 110 and thus reduce channeling by the implanted boron dopants 156.

In one version of the instant example, the first tilt angle 134 of FIG. 2A, the second tilt angle 140 of FIG. 2B, and the third tilt angle 146 of FIG. 2C may be equal to each other, advantageously simplifying fabrication of the integrated circuit 100, and ensuring a desired spatial configuration of the first angled carbon co-implanted region 136 of FIG. 2A, the second angled carbon co-implanted region 142 of FIG. 2B and the third angled carbon co-implanted region 148 of FIG. 2C under the gate 112. In a further version, the first tilt angle 134, the second tilt angle 140 and the third tilt angle 146 may be equal to the halo tilt angle 158, further simplifying fabrication of the integrated circuit 100, and ensuring a desired spatial configuration of the first angled carbon co-implanted region 136, the second angled carbon co-implanted region 142 and the third angled carbon co-implanted region 148 with respect to the halo implanted region 160 under the gate 112.

In an alternate version of the instant example, the third tilt angle 146 may be greater than the halo tilt angle 158, while still being within 5 degrees of the halo tilt angle 158. Implanting the third dose of carbon 144 at a greater tilt angle than the halo tilt angle 158 may advantageously provide that the third angled carbon co-implanted region 148 extends past the halo implanted region 160 by a desired distance under the gate 112.

Figure 2F:
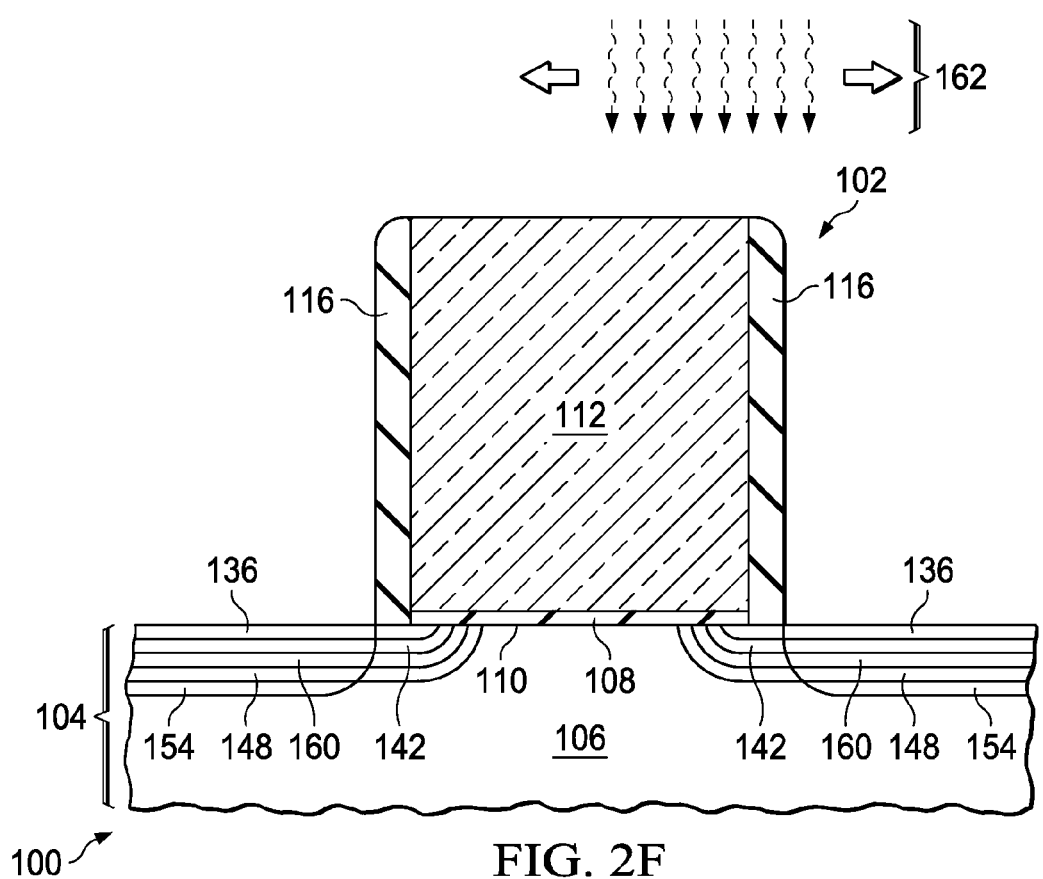

Referring to FIG. 2F, an anneal process 162 heats the top surface 110 of the substrate 104 to a temperature above 1200° C. for 1 microsecond to 1 millisecond, activating the boron in the halo implanted region 160 to form the halo region 126 of FIG. 1. The anneal process 162 may be, for example, a scanned laser anneal process as depicted in FIG. 2F, or a flash anneal process. The anneal process 162 causes the carbon in the first angled carbon co-implanted region 136, the second angled carbon co-implanted region 142, the third angled carbon co-implanted region 148 and the non-angled carbon co-implanted region 154 to diffuse to lattice sites and become substitutional carbon, forming the first carbon-diffused region 122, the second carbon-diffused region 124, the third carbon-diffused region 128 and the fourth carbon-diffused region 130, respectively, of FIG. 1. Forming the third angled carbon co-implanted region 148 to be deeper in the substrate 104 and extend further under the gate 112 than the halo implanted region 160 advantageously controls boron diffusion more effectively than a more shallow carbon-diffused region.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate comprising a p-type semiconductor material, the semiconductor material being primarily silicon;
a gate dielectric layer of an n-channel metal oxide semiconductor (NMOS) transistor disposed at a top surface of the p-type semiconductor material;
a gate of the NMOS transistor disposed on the gate dielectric layer;
a first carbon-diffused region disposed in the substrate adjacent to the gate, and extending a first distance under the gate, on a drain side of the gate and on a source side of the gate;
a second carbon-diffused region disposed in the substrate adjacent to the gate, on the drain side of the gate and on the source side of the gate, and extending a second distance under the gate, the second distance being greater than the first distance;
a halo region doped with boron disposed in the substrate adjacent to the gate, on the drain side of the gate and on the source side of the gate, and extending a third distance under the gate, the third distance being greater than the first distance; and
a third carbon-diffused region disposed in the substrate adjacent to the gate, on the drain side of the gate and on the source side of the gate, and extending a fourth distance under the gate, the fourth distance being greater than the third distance, wherein a total amount of carbon in the first carbon-diffused region, the second carbon-diffused region and the third carbon-diffused region is at least 5 times a total amount of boron in the halo region.

2. The integrated circuit of claim 1, wherein:
the total amount of carbon in the first carbon-diffused region, the second carbon-diffused region and the third carbon-diffused region corresponds to a total implant dose of at least $1 \times 10^{15}$ $cm^{-2}$; and
the total amount of boron in the halo region corresponds to a total implant dose of less than $1 \times 10^{14}$ $cm^{-2}$.

3. The integrated circuit of claim 1, wherein the gate has a physical gate length less than 30 nanometers.

4. The integrated circuit of claim 1, wherein:
the first distance is 1 nanometer to 10 nanometers;
the second distance is 1 nanometer to 5 nanometers greater than the first distance;
the third distance is 1 nanometer to 5 nanometers greater than the first distance; and
the fourth distance is 1 nanometer to 5 nanometers greater than the third distance.

5. The integrated circuit of claim 1, wherein the NMOS transistor comprises a fourth carbon-diffused region disposed in the substrate adjacent to the gate on the source side of the gate and on the drain side of the gate, wherein the fourth carbon-diffused region does not extend under that gate more than 1 nanometer, and wherein a total amount of carbon in the fourth carbon-diffused region corresponds to an implant dose of at least $1 \times 10^{14}$ $cm^{-2}$.

6. A method of forming an integrated circuit, comprising the steps:
providing a substrate comprising a p-type semiconductor material, the semiconductor material being primarily silicon;
forming a gate dielectric layer of an NMOS transistor at a top surface of the p-type semiconductor material;
forming a gate of the NMOS transistor on the gate dielectric layer;
implanting a first dose of carbon into the substrate adjacent to the gate, with a first tilt angle greater than 15 degrees;
implanting a second dose of carbon into the substrate adjacent to the gate, with a second tilt angle greater than 15 degrees, and with an energy 2 kilo-electron volts (keV) to 4 keV higher than an energy of the first dose of carbon;
implanting a third dose of carbon into the substrate adjacent to the gate, with a third tilt angle greater than 15 degrees and with an energy 2 keV to 4 keV higher than an energy of the second dose of carbon;
implanting boron dopants into the substrate adjacent to the gate, with a halo tilt angle greater than 15 degrees, and with an energy 2 keV to 4 keV less than the energy of the third dose of carbon, wherein the first tilt angle, the second tilt angle and the third tilt angle are each within 5 degrees of the halo tilt angle, and wherein a combined total carbon dose of the first dose of carbon, the second dose of carbon and the third dose of carbon is at least 5 times a total boron dose; and
subsequently annealing the top surface of the substrate by heating to a temperature above 1200° C. for 1 microsecond to 1 millisecond.

7. The method of claim 6, wherein the first tilt angle, the second tilt angle and the third tilt angle are all equal to each other.

8. The method of claim 6, wherein the first tilt angle, the second tilt angle and the third tilt angle are all equal to the halo tilt angle.

9. The method of claim 6, wherein the third tilt angle is greater than the halo tilt angle.

10. The method of claim 6, wherein the gate has a physical gate length less than 30 nanometers.

11. The method of claim 10, wherein the halo tilt angle is about 25 degrees to about 30 degrees.

12. The method of claim 6, comprising forming offset spacers 1 nanometer to 10 nanometers thick on the gate prior to implanting the first dose of carbon, implanting the second dose of carbon, implanting the third dose of carbon and implanting the boron dopants.

13. The method of claim 6, comprising implanting a fourth dose of carbon into the substrate adjacent to the gate, with a fourth tilt angle less than 4 degrees, with a total carbon dose of $1 \times 10^{14}$ cm$^{-2}$ to $1 \times 10^{15}$ cm$^{-2}$.

14. The method of claim 6, wherein the boron dopants are in the form of boron difluoride (BF$_2$).

15. The method of claim 6, wherein the combined total carbon dose of the first dose of carbon, the second dose of carbon and the third dose of carbon corresponds to a total implant dose of at least $1 \times 10^{15}$ cm$^{-2}$.

16. The method of claim 6, wherein implanting the first dose of carbon, implanting the second dose of carbon and implanting the third dose of carbon are performed prior to implanting the boron dopants.

17. The method of claim 6, wherein:
   implanting the first dose of carbon forms a first carbon-diffused region disposed in the substrate adjacent to the gate, and extending a first distance under the gate, on a drain side of the gate and on a source side of the gate;
   implanting the second dose of carbon forms a second carbon-diffused region disposed in the substrate adjacent to the gate, on the drain side of the gate and on the source side of the gate, and extending a second distance under the gate, the second distance being greater than the first distance;
   implanting the boron dopants forms a halo region doped with boron disposed in the substrate adjacent to the gate, on the drain side of the gate and on the source side of the gate, and extending a third distance under the gate, the third distance being greater than the first distance; and
   implanting the third dose of carbon forms a third carbon-diffused region disposed in the substrate adjacent to the gate, on the drain side of the gate and on the source side of the gate, and extending a fourth distance under the gate, the fourth distance being greater than the third distance, wherein a total amount of carbon in the first carbon-diffused region, the second carbon-diffused region and the third carbon-diffused region is at least 5 times a total amount of boron in the halo region.

18. The method of claim 17, wherein:
   the first distance is 1 nanometer to 10 nanometers;
   the second distance is 1 nanometer to 5 nanometers greater than the first distance;
   the third distance is 1 nanometer to 5 nanometers greater than the first distance; and
   the fourth distance is 1 nanometer to 5 nanometers greater than the third distance.

19. A method of forming an integrated circuit, comprising the steps:
   providing a substrate comprising a p-type semiconductor material, the semiconductor material being primarily silicon;
   forming a gate dielectric layer of an NMOS transistor at a top surface of the p-type semiconductor material;
   forming a gate of the NMOS transistor with a physical gate length less than 30 nanometers on the gate dielectric layer;
   implanting a first dose of carbon into the substrate adjacent to the gate, with a first tilt angle;
   implanting a second dose of carbon into the substrate adjacent to the gate, with a second tilt angle, and with an energy 2 keV to 4 keV higher than an energy of the first dose of carbon;
   implanting a third dose of carbon into the substrate adjacent to the gate, with a third tilt angle, and with an energy 2 keV to 4 keV higher than an energy of the second dose of carbon;
   implanting a fourth dose of carbon into the substrate adjacent to the gate, with a fourth tilt angle less than 4 degrees;
   subsequently implanting boron dopants in the form of BF$_2$ into the substrate adjacent to the gate, with a halo tilt angle of about 25 degrees to about 30 degrees, and with an energy 2 keV to 4 keV less than the energy of the third dose of carbon, wherein the first tilt angle, the second tilt angle and the third tilt angle are substantially equal to the halo tilt angle, and wherein a combined total carbon dose of the first dose of carbon, the second dose of carbon and the third dose of carbon is at least 5 times a total boron dose; and
   subsequently annealing the top surface of the substrate by heating to a temperature above 1200° C. for 1 microsecond to 1 millisecond by a scanned laser anneal process.

20. The method of claim 19, wherein:
   implanting the first dose of carbon forms a first carbon-diffused region disposed in the substrate adjacent to the gate, and extending a first distance under the gate, on a drain side of the gate and on a source side of the gate;
   implanting the second dose of carbon forms a second carbon-diffused region disposed in the substrate adjacent to the gate, on the drain side of the gate and on the source side of the gate, and extending a second distance under the gate, the second distance being greater than the first distance;
   implanting the boron dopants forms a halo region doped with boron disposed in the substrate adjacent to the gate, on the drain side of the gate and on the source side of the gate, and extending a third distance under the gate, the third distance being greater than the first distance;
   implanting the third dose of carbon forms a third carbon-diffused region disposed in the substrate adjacent to the gate, on the drain side of the gate and on the source side of the gate, and extending a fourth distance under the gate, the fourth distance being greater than the third distance, wherein a total amount of carbon in the first carbon-diffused region, the second carbon-diffused region and the third carbon-diffused region is at least 5 times a total amount of boron in the halo region; and
   implanting the fourth dose of carbon forms a fourth carbon-diffused region disposed in the substrate adjacent to the gate, on the drain side of the gate and on the source side of the gate, and extending a fifth distance under the gate, the fifth distance being less than the first distance.

* * * * *